United States Patent
Miyamae

(10) Patent No.: US 9,838,043 B2
(45) Date of Patent: Dec. 5, 2017

(54) STORAGE SYSTEM, INFORMATION PROCESSOR, AND COMPUTER-READABLE RECORDING MEDIUM HAVING STORED THEREIN PROGRAM FOR GENERATING PARITY

(71) Applicant: FUJITSU LIMITED, Kawasaki-shi, Kanagawa (JP)

(72) Inventor: Takeshi Miyamae, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 38 days.

(21) Appl. No.: 15/055,677

(22) Filed: Feb. 29, 2016

(65) Prior Publication Data

US 2016/0285474 A1     Sep. 29, 2016

(30) Foreign Application Priority Data

Mar. 27, 2015  (JP) .................... 2015-065500

(51) Int. Cl.
| | |
|---|---|
| H03M 13/37 | (2006.01) |
| H03M 13/09 | (2006.01) |
| H03M 13/00 | (2006.01) |
| G06F 12/08 | (2016.01) |
| G06F 11/20 | (2006.01) |
| G06F 11/14 | (2006.01) |
| G06F 11/10 | (2006.01) |
| G06F 12/0868 | (2016.01) |
| G06F 12/0804 | (2016.01) |

(52) U.S. Cl.
CPC ....... *H03M 13/3761* (2013.01); *G06F 11/108* (2013.01); *G06F 11/1076* (2013.01);
(Continued)

(58) Field of Classification Search
CPC ............ H03M 13/3761; H03M 13/093; G06F 11/1471; G06F 11/2094; G06F 11/108; G06F 12/0868
(Continued)

(56) References Cited

U.S. PATENT DOCUMENTS 5,522,065 A * 5/1996 Neufeld ............. G06F 11/1076
                                                            711/100
5,996,046 A * 11/1999 Yagisawa ............ G06F 11/1076
                                                            711/112
(Continued)

FOREIGN PATENT DOCUMENTS

JP    H08-81424 A     4/1996
JP    2006-338461 A   12/2006

*Primary Examiner* — James C Kerveros
(74) *Attorney, Agent, or Firm* — Fujitsu Patent Center

(57) ABSTRACT

A storage system includes a first information processor, a second information processor, and a superordinate device. The first information processor includes a first memory device that stores therein the data, a difference generator that generates difference data representing a difference between updating data received from the superordinate device and the data stored in the first memory device before updating, a second memory device stores therein the generated difference data, and a data transmitter that transmits the stored difference data to the second information processor. The second information processor includes a third memory device that stores therein the parity, a data receiver that receives the difference data transmitted from the data transmitter, and a parity difference applier that generates a post-updating parity that is to be written into the third memory device by applying the received difference data to the stored parity before the updating.

12 Claims, 8 Drawing Sheets

(52) U.S. Cl.
CPC ...... *G06F 12/0804* (2013.01); *G06F 12/0868* (2013.01); *G06F 11/1471* (2013.01); *G06F 11/2094* (2013.01); *G06F 2211/1059* (2013.01); *H03M 13/093* (2013.01); *H03M 13/611* (2013.01)

(58) Field of Classification Search
USPC .......................................................... 714/763
See application file for complete search history.

(56) References Cited

U.S. PATENT DOCUMENTS

| | | | |
|---|---|---|---|
| 7,188,303 B2* | 3/2007 | Schmisseur | G06F 11/1076 714/758 |
| 8,266,342 B1* | 9/2012 | Takada | G06F 3/0613 345/537 |
| 8,549,381 B2* | 10/2013 | Kitahara | G06F 3/0613 714/763 |
| 8,700,975 B2* | 4/2014 | Yoshihara | G06F 12/0246 714/770 |
| 8,719,621 B1* | 5/2014 | Karmarkar | G06F 11/1076 714/6.1 |
| 9,311,181 B2* | 4/2016 | Lee | G06F 11/1048 |
| 9,367,469 B2* | 6/2016 | Ogawa | G06F 12/0871 |
| 2005/0081087 A1* | 4/2005 | Yagisawa | G06F 11/008 714/6.22 |
| 2006/0277226 A1 | 12/2006 | Chikusa et al. | |
| 2007/0220313 A1* | 9/2007 | Katsuragi | G06F 11/0727 714/6.22 |
| 2014/0136920 A1* | 5/2014 | Lee | G06F 11/1048 714/758 |

* cited by examiner

STORAGE SYSTEM, INFORMATION PROCESSOR, AND COMPUTER-READABLE RECORDING MEDIUM HAVING STORED THEREIN PROGRAM FOR GENERATING PARITY

CROSS-REFERENCE TO RELATED APPLICATION

This application is based upon and claims the benefit of priority of the prior Japanese Patent application No. 2015-065500, filed on Mar. 27, 2015, the entire contents of which are incorporated herein by reference.

FIELD

The embodiment discussed herein is directed to a storage system, an information processor, and a computer-readable recording medium having stored therein a program for generating a parity.

BACKGROUND

A distributed storage system has been known which arranges data and a parity in different nodes. Since the Erasure Code in a distributed storage system arranges data and a parity in different nodes, data updating accompanies a distributed transaction. As one of the known techniques for such a storage system, each nodes records post-updating image data in the form of a journal in preparation for possible node failure, so that the reliability of the transaction can be improved.

Accompanying drawing FIG. 7 denotes a process of writing a journal in a traditional storage system; and FIG. 8 denotes a process of applying the journal in the same system.

A storage system (distributed storage system) 100a of FIGS. 7 and 8 provides a memory region to a non-illustrated host device. The storage system 100a includes multiple (three in the illustrated example) data nodes 1a (data nodes #1-#3) and multiple (two in the illustrated example) parity nodes 2a (parity nodes #1 and #2). This means that FIGS. 7 and 8 illustrate an example that the stripe of the Erasure Code consists of three data chunks and two parity chunks. Each data node 1a is communicably connected to each parity node 2a via, for example, a Local Area Network (LAN) cable.

Hereinafter, each individual data node is specified by "data node #1", "data node #2", or "data node #3", but an arbitrary data node is represented by "data node 1a". Likewise, each individual parity node is specified by "parity node #1" or "parity node #2", but an arbitrary parity node is represented by "parity node 2a".

A data node 1a stores therein data received from an external device such as the non-illustrated host device, and includes a Central Processing Unit (CPU) 11a, a file store 13a, a journal disk 14a, and a non-illustrated memory. The data nodes #1-#3 have the same functional configuration, FIGS. 7 and 8 omit illustration of the functional configurations of the data nodes #1 and #3.

The CPU 11a is a processor that executes various controls and calculations, and achieves various functions by executing an Operating System (OS) and a program stored in the non-illustrated memory.

The file store 13a is a known device that readably and writably stores therein data received by the data node 1a, and is exemplified by a Hard Disk Drive (HDD) or a Solid State Drive (SSD).

The journal disk 14a is a known device that readably and writably stores therein a journal, which is a record of data received by the data node 1a, and is exemplified by an HDD or an SDD.

A parity node 2a is a node that stores therein a parity of data stored in the data node 1a, and includes a CPU 21a, a file store 23a, a journal disk 24a, and a non-illustrated memory. Since the parity nodes #1 and #2 have the same functional configuration, FIGS. 7 and 8 omit illustration of the functional configuration of the parity node #1.

The CPU 21a is a processor that executes various controls and calculations, and achieves various functions by executing an Operating System (OS) and a program stored in the non-illustrated memory.

The file store 23a is a known device that readably and writably stores therein a parity of data received by the data node 1a, and is exemplified by an HDD or an SSD.

The journal disk 24a is a known device that readably and writably stores therein a journal of a parity to be stored in the file store 23a, and is exemplified by an HDD or an SDD.

Hereinafter, description will now be made in relation to a process of writing a journal and a process of applying the journal in a traditional storage system with reference to FIGS. 7 and 8. For simplification of the description to be made by referring to FIGS. 7 and 8, a process by "the CPU 11a of the data node #2" is referred to as "a process by the data node #2", and likewise a process by "the CPU 21a of the parity node #2" is referred to as "a process by the parity node #2".

The data node #2 receives updating data "7" from a non-illustrated host device (see symbol B1 in FIG. 7).

The data node #2 reads pre-updating data "4" from the file store 13a (see symbol B2 in FIG. 7).

The data node #2 calculates the difference between the updating data and the pre-updating data (see symbol B3 in FIG. 7). In the example of FIG. 7, the data node #2 calculates the value "3" to be the difference data by subtracting the pre-updating data "4" from the updating data "7".

The data node #2 writes updating data (post-updating data) "7" into the journal disk 14a (see symbol B4 in FIG. 7).

The data node #2 forwards the calculated difference data "3" to the parity node #2 (see symbol B5 in FIG. 7).

The parity node #2 receives the difference data "3" from the data node #2 (see symbol B6 in FIG. 7).

The parity node #2 reads a pre-updating parity from the file store 23a (see symbol B7 in FIG. 7).

The parity node #2 applies the difference to the pre-updating parity (see symbol B8 in FIG. 7). In the example of FIG. 7, the data node #2 calculates a post-updating parity "5" by adding the difference data "3" to the pre-updating parity "2".

The parity node #2 writes the calculated post-updating parity "5" into the journal disk 24a (see symbol B9 in FIG. 7).

Next, the data node #2 reads a journal from the journal disk 14a for applying the journal (see symbol B10 in FIG. 8).

Then, the data node #2 writes the read journal into the file store 13a (see symbol B11 in FIG. 8).

The parity node #2 reads a journal from the journal disk 24a for applying the journal (see symbol B12 in FIG. 8).

The parity nodes #2 writes the read journal into the file store 13a (see symbol B13 in FIG. 8).

[Patent Literature 1] Japanese Laid-open Patent Publication No. 08-87424

[Patent Literature 2] Japanese Laid-open Patent Publication No. 2006-338461

In the traditional storage system 100a, the data node 1a and the parity node 2a include dedicated journal disks 14a and 24a, respectively. With this configuration, the data node 1a writes the post-updating data, as a journal, into the journal disk 14a while the parity node 2a writes a post-updating parity, as a journal, into the journal disk 24a. Accordingly, an increase in the number of parity nodes 2a accompanies an increase in the data volume of the journals, which needs more disk volume. Furthermore, the storage system 100a endures increased Input/Output (I/O) overhead.

SUMMARY

With the above in view, there is provided a storage system including a first information processor that stores therein data, a second information processor that is communicably connected to the first information processor and that stores therein a parity of the data, and a superordinate device that is communicably connected to the first information processor. The first information processor includes a first memory device that stores therein the data, a difference generator that generates difference data representing a difference between updating data received from the superordinate device and the data stored in the first memory device before updating, a second memory device stores therein the difference data generated by the difference generator, and a data transmitter that transmits the difference data stored in the second memory device to the second information processor. The second information processor includes a third memory device that stores therein the parity, a data receiver that receives the difference data transmitted from the data transmitter, and a parity difference applier that generates a post-updating parity that is to be written into the third memory device by applying the difference data received by the data receiver to the parity stored in the third memory device before the updating.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
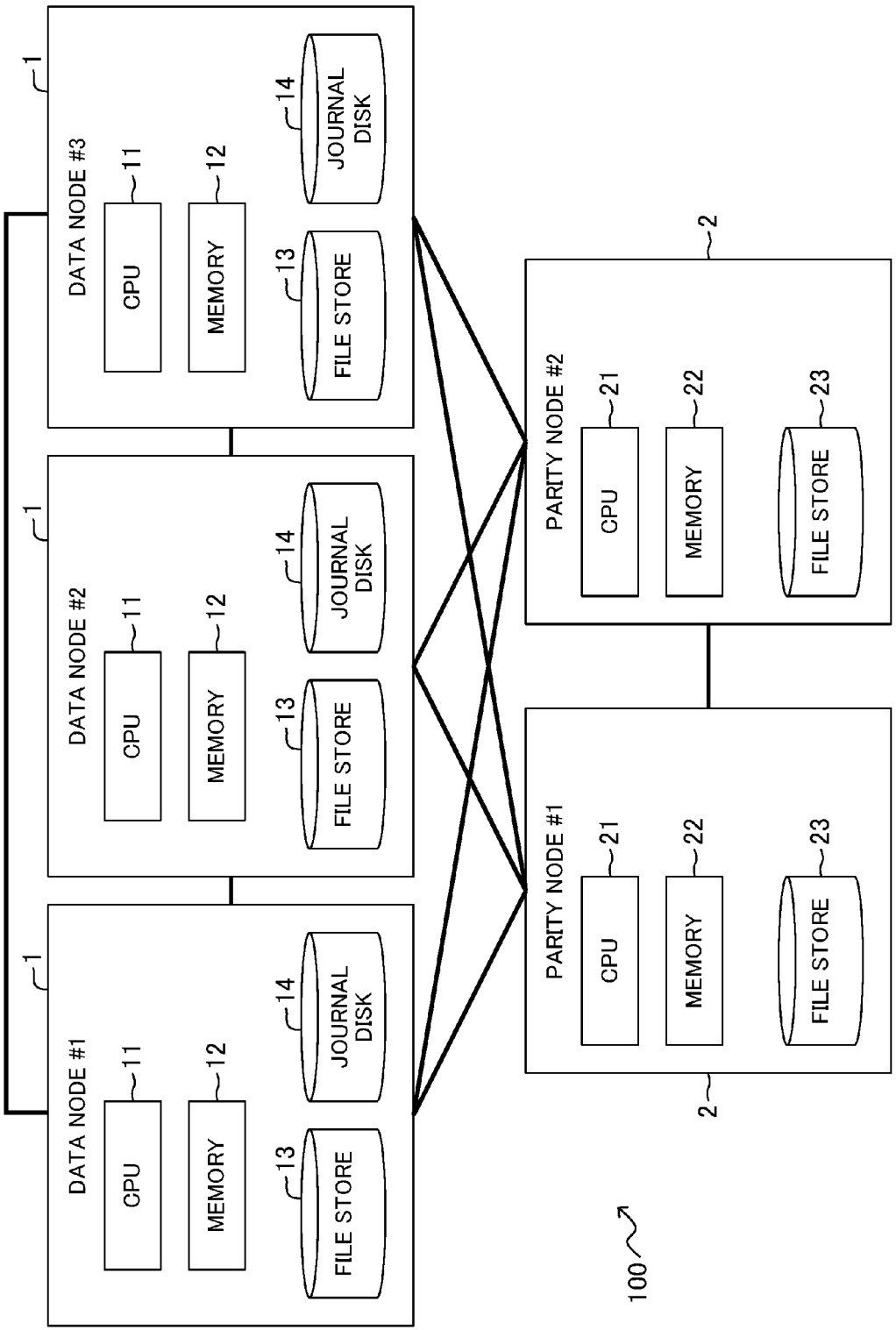
FIG. 1 is a diagram schematically illustrating the functional configuration of a storage system according a first embodiment.

Hereinafter, description will now be made in relation to a storage system, an information processor, and a computer-readable recording medium having stored therein a program for generating a parity with reference to accompanying drawings. However, the embodiment to be detailed below is are merely example and does not intend to exclude another modification and application of techniques that are not referred in this description. In other words, various changes and modification can be suggested without departing from the gist of the embodiment.

The accompanying drawings may include other elements and functions in addition to those appearing in the drawings.

Like reference numbers designate the same or the substantially same parts or elements in the accompanying drawings, so repetitious description is omitted here.

(A) First Embodiment (A-1) System Configuration:

FIG. 1 schematically illustrates the functional configuration of a storage system according to a first embodiment.

A storage system 100 illustrated in FIG. 1 provides a memory region to a non-illustrated host device (superordinate device), and functions as a distributed storage system that distributedly stores data into multiple data nodes 1. The storage system 100 includes multiple (three in the illustrated example) data nodes 1 (data nodes #1-#3; first information processors) and multiple (two in the illustrated example) parity nodes 2 (parity nodes #1 and #2; second information processors). This means that FIG. 1 illustrates an example that the stripe of the Erasure Code consists of three data chunks and two parity chunks. Each data node 1 is communicably connected to each parity node 2 via, for example, a LAN cable.

Hereinafter, each individual data node is specified by "data node #1", "data node #2", or "data node #3", but an arbitrary data node is represented by "data node 1". Likewise, each individual parity node is specified by "parity node #1" or "parity node #2", but an arbitrary parity node is represented by "parity node 2".

A data node 1 stores therein data received from an external device such as the non-illustrated host device, and includes a CPU 11, a memory 12, a file store (first memory device) 13, and a journal disk (second memory device) 14.

The file store 13 is a known device that readably and writably stores therein data received by the data node 1, and is exemplified by an HDD or an SSD.

The journal disk 14 is a known device that readably and writably stores therein a journal (updating history, updated difference), which is a record of data received by the data node 1a, and is exemplified by an HDD or an SDD.

The memory 12 is a memory device including a Read Only Memory (ROM), and a Random Access Memory (RAM). In the ROM of the memory 12, a program such as Basic Input/Output System (BIOS) is written. A software program stored in the memory 12 is appropriately read by the CPU 11, which then executes the program. The RAM of the memory 12 is used as a primary recording memory and a working memory.

The CPU 11 is a processor that executes various controls and calculations, and achieves various functions by executing an OS and a program stored in the memory 12. Specifically, as will be detailed below by referring to FIG. 2, the CPU 11 functions as a data receiver 111, a file store reader 112, a difference generator 113, a journal writer 114, a journal reader 115, a difference applier (data difference applier) 116, a file store writer 117, and a data transmitter 118.

A program (program for generating a parity) that achieves the functions of the data receiver 111, the file store reader 112, the difference generator 113, the journal writer 114, the journal reader 115, the difference applier 116, the file store writer 117, and the data transmitter 118 is provided in the form of being recorded in a tangible and non-transitory computer-readable storage medium, such as a flexible disk, a CD (e.g., CD-ROM, CD-R, and CD-RW), a DVD (DVD-ROM, DVD-RAM, DVD-R, DVD+R, DVD-RW, DVD+RW, and HD DVD), a Blu-ray disk, a magnetic disk, an optical disk, and an magneto-optical disk. A computer reads the program from the recording medium using a non-illustrated medium reader and stores the read program in an internal or external storage device for future use. Alternatively, the program may be recorded in a recording device (recording medium), such as a magnetic disk, an optical disk, or a magneto-optical disk, and may be provided from the recording device to the computer via a communication path.

Further alternatively, in achieving the functions of the data receiver 111, the file store reader 112, the difference generator 113, the journal writer 114, the journal reader 115, the difference applier 116, the file store writer 117, and the data transmitter 118, the program stored in an internal memory device (corresponding to the memory 12 in this embodiment) is executed by the microprocessor (corresponding to the CPU 11 in this embodiment) of the computer. For this purpose, the computer may read the program stored in the recording medium and execute the program.

A parity node 2 is a node that stores therein a parity of data stored in the data node 1, and includes a CPU 21, a memory 22, and a file store 23 (third memory device).

The file store 23 is a known device that readably and writably stores therein a parity of data to be stored in the data node 1, and is exemplified by an HDD or an SSD.

The memory 22 is a memory device including a ROM and a RAM. In the ROM of the memory 22, a program such as the BIOS is written. A software program stored in the memory 22 is appropriately read by the CPU 21, which then executes the program. The RAM of the memory 22 is used as a primary recording memory and a working memory.

The CPU 21 is a processor that executes various controls and calculations, and achieves various functions by executing an OS and a program stored in the memory 22. Specifically, as will be detailed below by referring to FIG. 3, the CPU 21 functions as a data receiver 211, a file store reader 212, a difference applier (parity difference applier) 213, and a file store writer 214.

A program (program for generating a parity) that achieves the functions of the data receiver 211, the file store reader 212, the difference applier 213, and the file store writer 214 is provided in the form of being recorded in a tangible and non-transitory computer-readable storage medium, such as a flexible disk, a CD (e.g., CD-ROM, CD-R, and CD-RW), a DVD (DVD-ROM, DVD-RAM, DVD-R, DVD+R, DVD-RW, DVD+RW, and HD DVD), a Blu-ray disk, a magnetic disk, an optical disk, and an magneto-optical disk. A computer reads the program from the recording medium using a non-illustrated medium reader and stores the read program in an internal or external storage device for future use. Alternatively, the program may be recorded in a recording device (recording medium), such as a magnetic disk, an optical disk, or a magneto-optical disk, and may be provided from the recording device to the computer via a communication path.

Further alternatively, in achieving the functions of the data receiver 211, the file store reader 212, the difference applier 213, and the file store writer 214, the program stored in an internal memory device (corresponding to the memory 22 in this embodiment) is executed by the microprocessor (corresponding to the CPU 21 in this embodiment) of the computer. For this purpose, the computer may read the program stored in the recording medium and execute the program.

Figure 2:
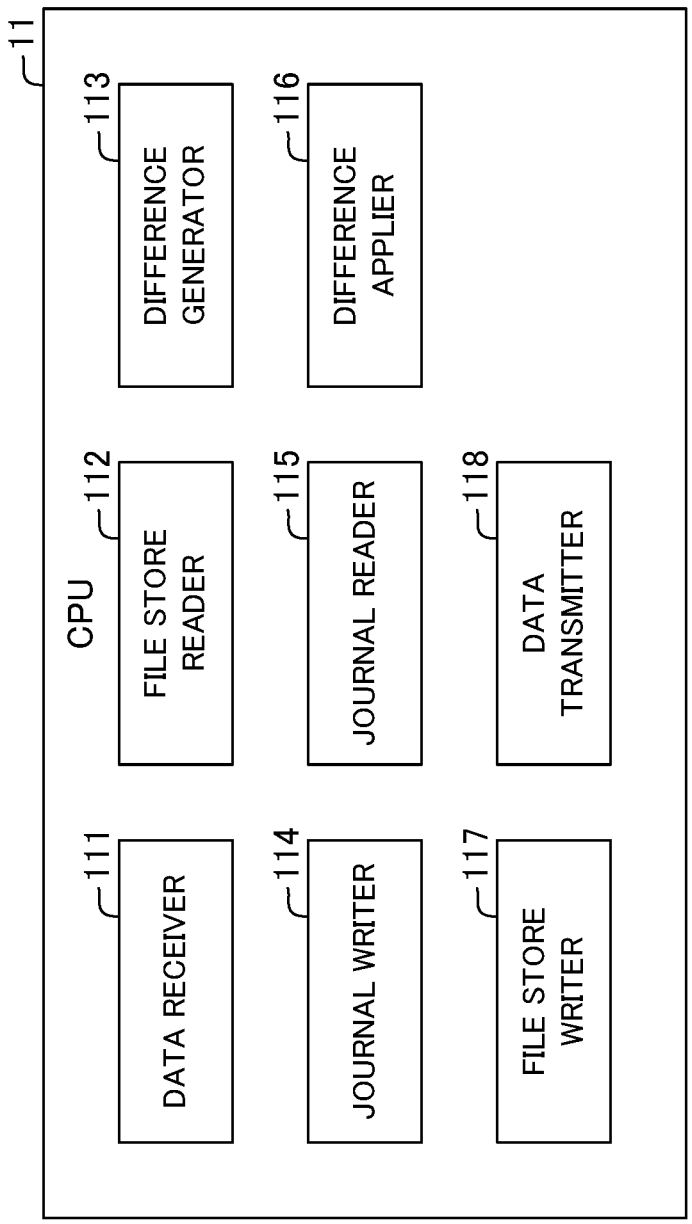
FIG. 2 is a diagram schematically illustrating the functional configuration of a CPU included in a data node of the first embodiment.

FIG. 2 schematically illustrates the functional configuration of a CPU included in each data node of this embodiment.

The data receiver 111 receives data (updating data) from an external device such as a non-illustrated host device. Specifically, the data receiver 111 of each of the data nodes #1-#3 segments data that the corresponding node received from the external device into chunks in a unit of several bytes (e.g., four bytes) and receives the segmented chunks. Storing data into the file store 13 of a data node 1, calculating of a parity in a parity node 2, and storing of a parity into the file store 23 are carried out in units of a segmented chunk.

The file store reader 112 reads data stored in the file store 13. Specifically, the file store reader 112 reads, when the data receiver 111 receives updating data, pre-updating data stored in a region to be updated of the file store 13. The file store reader 112 further reads pre-updating data stored in the file store 13 at the timing of applying a journal that is to be detailed below.

The difference generator 113 generates difference information. Specifically, the difference generator 113 generates difference information representing a difference between the updating data received by the data receiver 111 and the pre-updating data read from the file store 13 by the file store reader 112. As described above, since a parity is calculated in units of a segmented chunk in the first embodiment, the difference generator 113 performs a subtraction of the bit length on the Galois Field using the updating data (post-updating image) and pre-updating data (pre-updating image) along the following expression.

$$\Delta D = D_{ai} - D_{bi} \qquad \text{[Expression 1]}$$

Here, the term $D_{ai}$ represents a post-updating image; the term $D_{bi}$ represents a pre-updating image; and the negative sign "−" represents the subtraction on the Galois Field. Consequently, the difference generator 113 defines the difference segmented in units of several bytes.

The journal writer 114 writes data into a journal. Specifically, the journal writer 114 writes the difference data generated by the difference generator 113 to be a journal into the journal disk 14.

Figure 7:
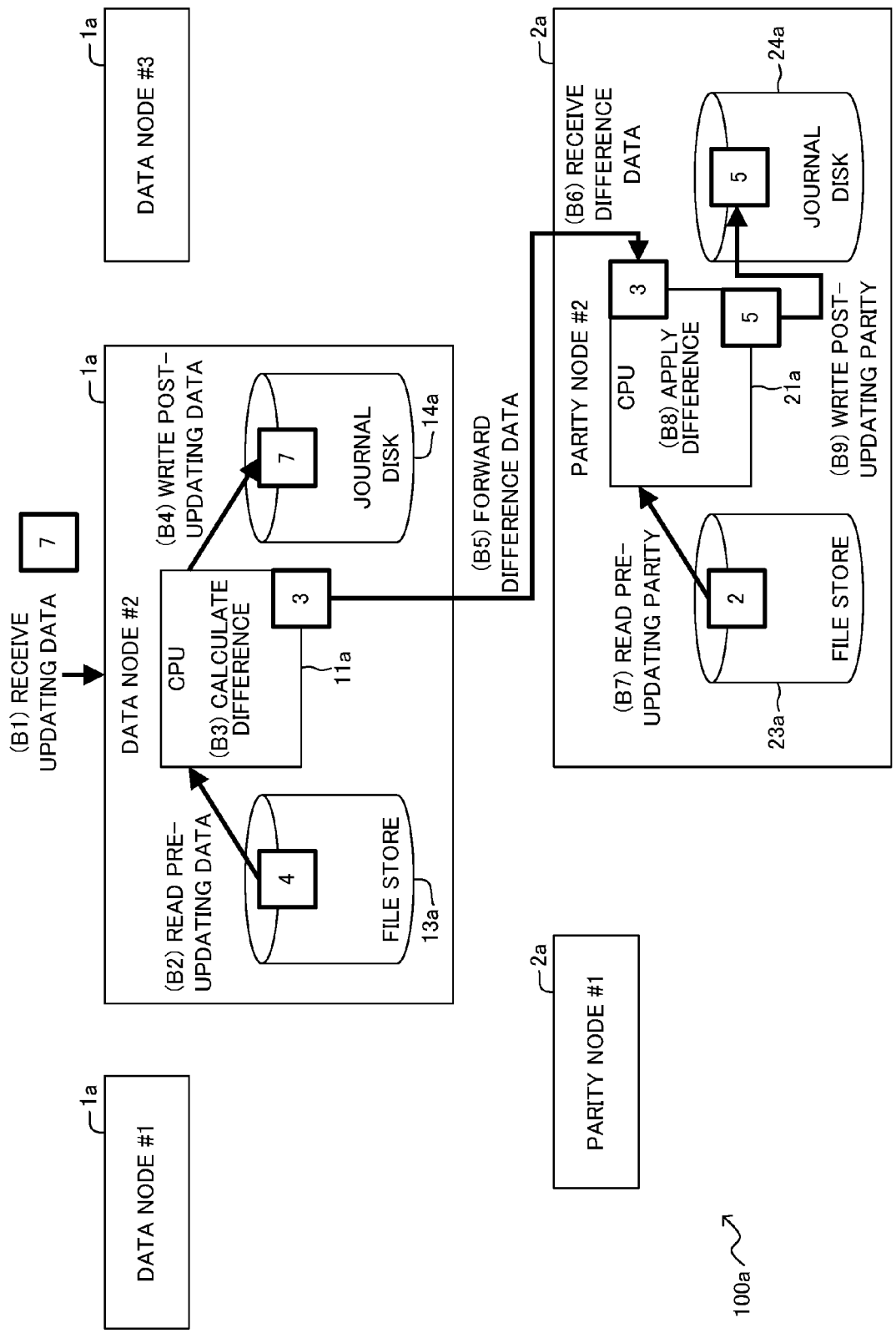
FIG. 7 is a diagram denoting a process of writing a journal in a traditional storage system.
Figure 8:
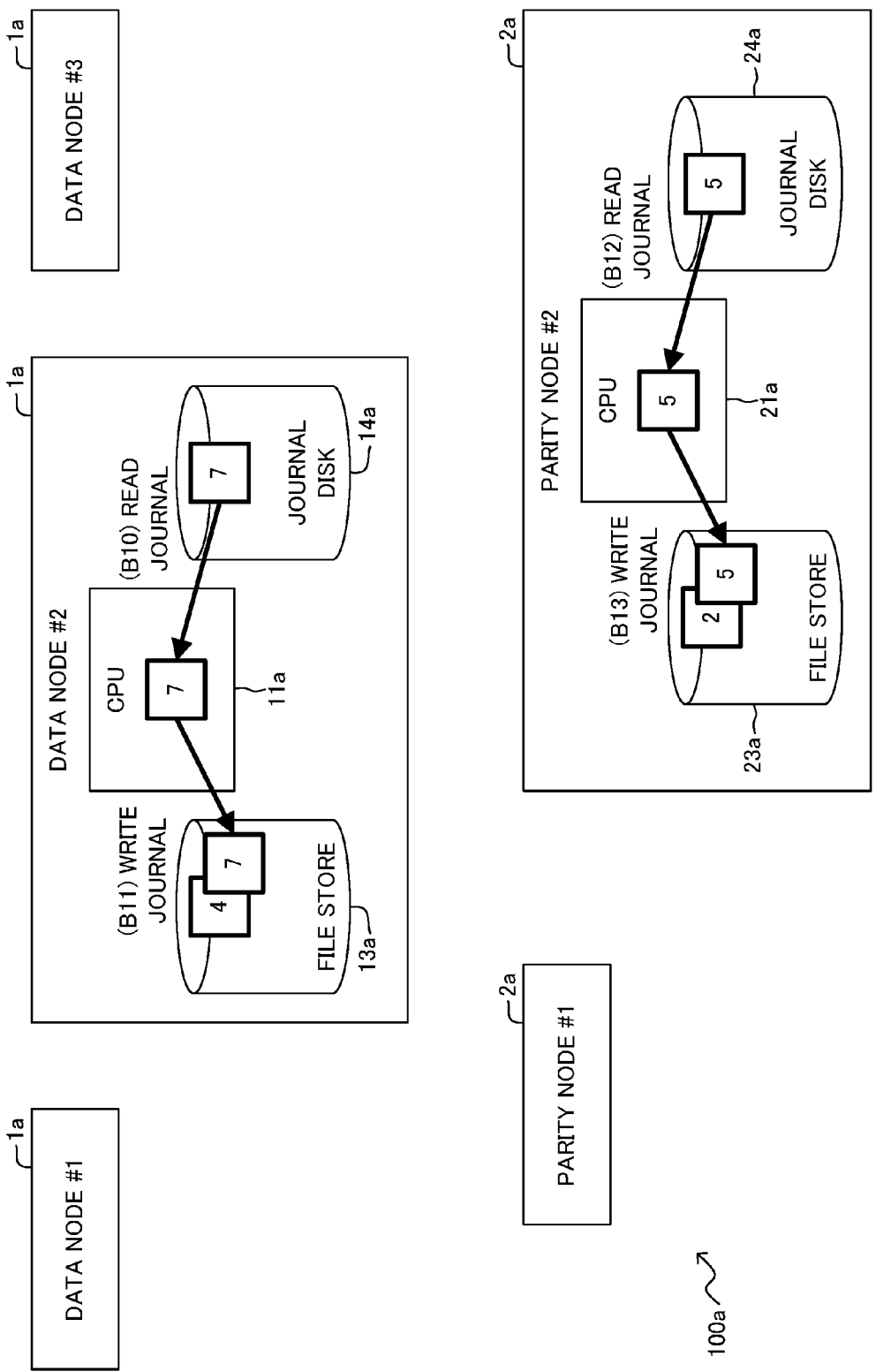
FIG. 8 is a diagram is a diagram denoting a process of applying a journal in a traditional storage system.

The data node 1a of the traditional system illustrated in FIGS. 7 and 8 writes a post-updating image to be a journal. In contrast, the journal writer 114 of the data node 1 of this embodiment writes a Galois updating difference calculated by the difference generator 113 to be the journal.

The journal reader 115 reads data from a journal. Specifically, the journal reader 115 reads the difference data written by the journal writer 114 from the journal disk 14 at a timing of applying a journal. Here, examples of the timing of applying a journal is a timing at which the void volume of the journal disk 14 runs short or when a predetermined time has elapsed since the previous applying of a journal.

The difference applier 116 generates post-updating data to be written into the file store 13. Specifically, the difference applier 116 applies (for example, adds) the difference data that the journal reader 115 has read from the journal disk 14 to the pre-updating data that the file store reader 112 has read from the file store 13. Consequently, the difference applier 116 generates a post-updating data.

The file store writer 117 writes data into the file store 13. Specifically, the file store writer 117 writes the post-updating data generated by the difference applier 116 into the file store 13.

The data transmitter 118 transmits data to the parity node 2. Specifically, the data transmitter 118 transmits the difference data read by the journal reader 115 from the journal disk 14 to the parity node 2.

The traditional data node 1a described by referring to FIGS. 7 and 8 forwards the calculated updating difference to the parity node 2a after the completion of the process in the data node 1a (or in parallel with the process of writing of the journal). In contrast, the data transmitter 118 in the data node 1 of this embodiment forwards the updating difference read from the journal disk 14 to the parity node 2 at any timing until the journal is invalidated.

Alternatively, the data transmitter 118 may transmit the difference data to multiple parity nodes 2 for maintain data redundancy. In this case, the parity nodes 2 execute the process in parallel with one another.

Figure 3:
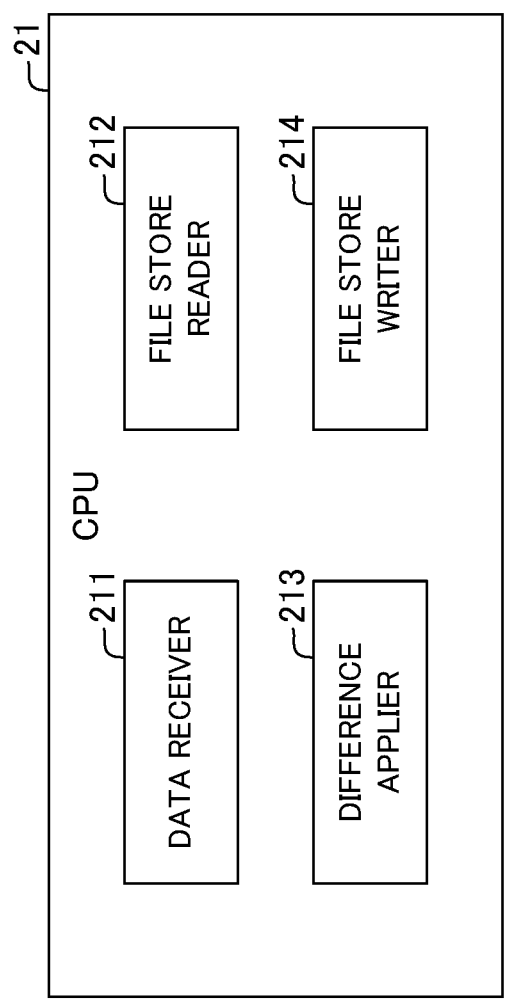
FIG. 3 is a diagram schematically illustrating the functional configuration of a CPU included in a parity node of the first embodiment.

FIG. 3 schematically illustrates the functional configuration of the CPU included in the parity node of the first embodiment.

The data receiver 211 receives data from the data node 1. Specifically, the data receiver 211 receives the difference data transmitted from the data transmitter 118 of the data node 1.

The file store reader 212 reads a parity from the file store 23. Specifically, the file store reader 212 reads, when the data receiver 211 receives the difference data, pre-updating parity stored in the file store 23.

The difference applier 213 generates a post-updating parity to be written into the file store 23. Specifically, the difference applier 213 applies (for example, adds) the difference data received by the data receiver 211 to the pre-updating parity that the file store reader 212 has read from the file store 23. Consequently, the difference applier 213 generates the post-updating parity.

The file store writer 214 writes a parity into the file store 23. Specifically, the file store writer 214 writes the post-updating parity generated by the difference applier 213 into the file store 23.

The traditional parity node 2a illustrated in FIGS. 7 an 8 writes a post-updating parity into the file store 23a and further generates a post-updating parity by applying the difference data to a pre-updating parity. The parity node 2a writes the generated post-updating parity as a journal into the journal disk 24a, in contrast, the parity node 2 according to this embodiment is not equipped with a journal disk to store a journal, and the file store writer 214 writes a Galois updating difference forwarded from the data node 1 directly into the file store 23.

In the first embodiment, there is no need to apply a journal to the file store 23 of the parity node 2 each time a journal is generated. Specifically, the data node 1 is allowed to forward a journal (difference data) of the sum of several journals in a lump to the parity node 2, which then applies the forwarded journals to the file store 23 all at once. Hereinafter, the reason for the above will now be detailed.

Representing a generation matrix for a linear block code by $(a_{ij})$ and representing a data chunk by $D_j$, the parity chunk $P_i$ is represented by the following expression. Here, the symbols i and j are natural numbers; the symbol i represents the parity number and the symbol j represents a value specifying a coefficient depending on data.

$$P_i = a_{i1}D_1 + a_{i2}D_2 + \ldots + a_{in}D_n \quad \text{[Expression 2]}$$

Here, representing a Galois difference journal of one or more pieces of data $D_k$ by $\Sigma \Delta D_k$, the post-updating image $D_k'$ of a data chunk is represented by the following expression.

$$D_k' = D_k + \Sigma \Delta D_k \quad \text{[Expression 3]}$$

Accordingly, the post-updating image $P_i'$ of a parity chunk is represented by the following expression.

$$\begin{aligned} P_i' &= a_{i1}D_1 + \ldots + a_{ik}D_k' + \ldots + a_{in}D_n \quad \text{[Expression 4]} \\ &= a_{i1}D_1 + \ldots + a_{ik}(D_k + \sum \Delta D_k) + \ldots + a_{in}D_n \\ &= P_i + a_{ik} \sum \Delta D_k \end{aligned}$$

The Galois difference journal $\Sigma \Delta D_k$ of a data chunk is recorded as a journal of a parity chunk without being modified, and a product of the journal of a parity chunk and the coefficient $(a_{ik})$ is added to the pre-post image of the parity chunk. This calculates the post-updating image $P_i'$ of the parity chunk.

(A-2) Operation:

Description will now be made in relation to a process of writing a journal and a process of applying a journal in a storage system of an example of the first embodiment along the sequence diagram FIG. 4 (steps S1-S13) with reference to FIGS. 5 and 6. Here, steps S1-S4 of FIG. 4 and symbols A1-A4 of FIG. 5 represent a process of writing a journal and steps S5-S13 of FIG. 4 and symbols A5-A13 of FIG. 6 represent a process of applying a journal.

Figure 4:
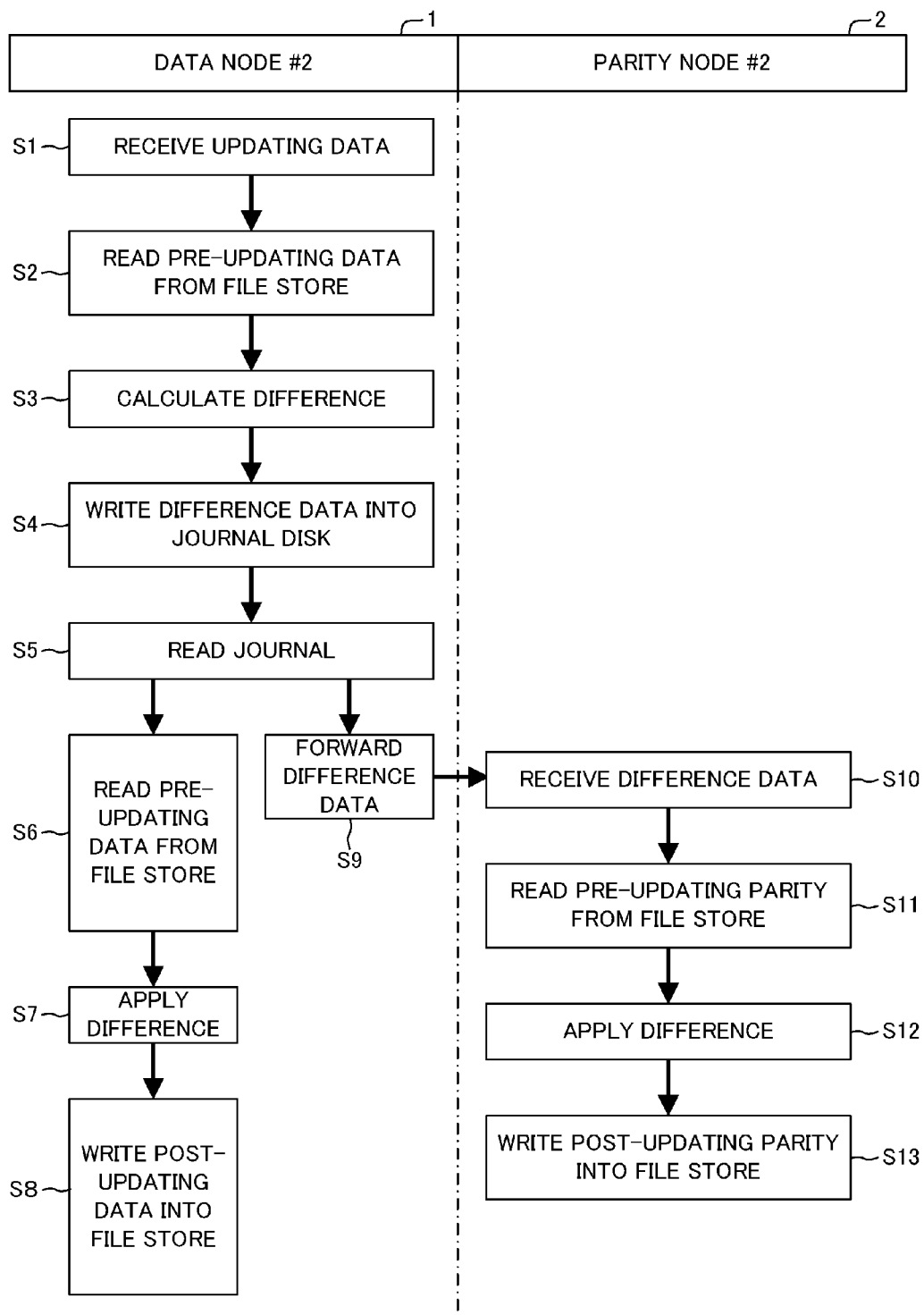
FIG. 4 is a sequence diagram denoting a process of writing a journal and a process of applying the journal in a storage system of the first embodiment.
Figure 5:
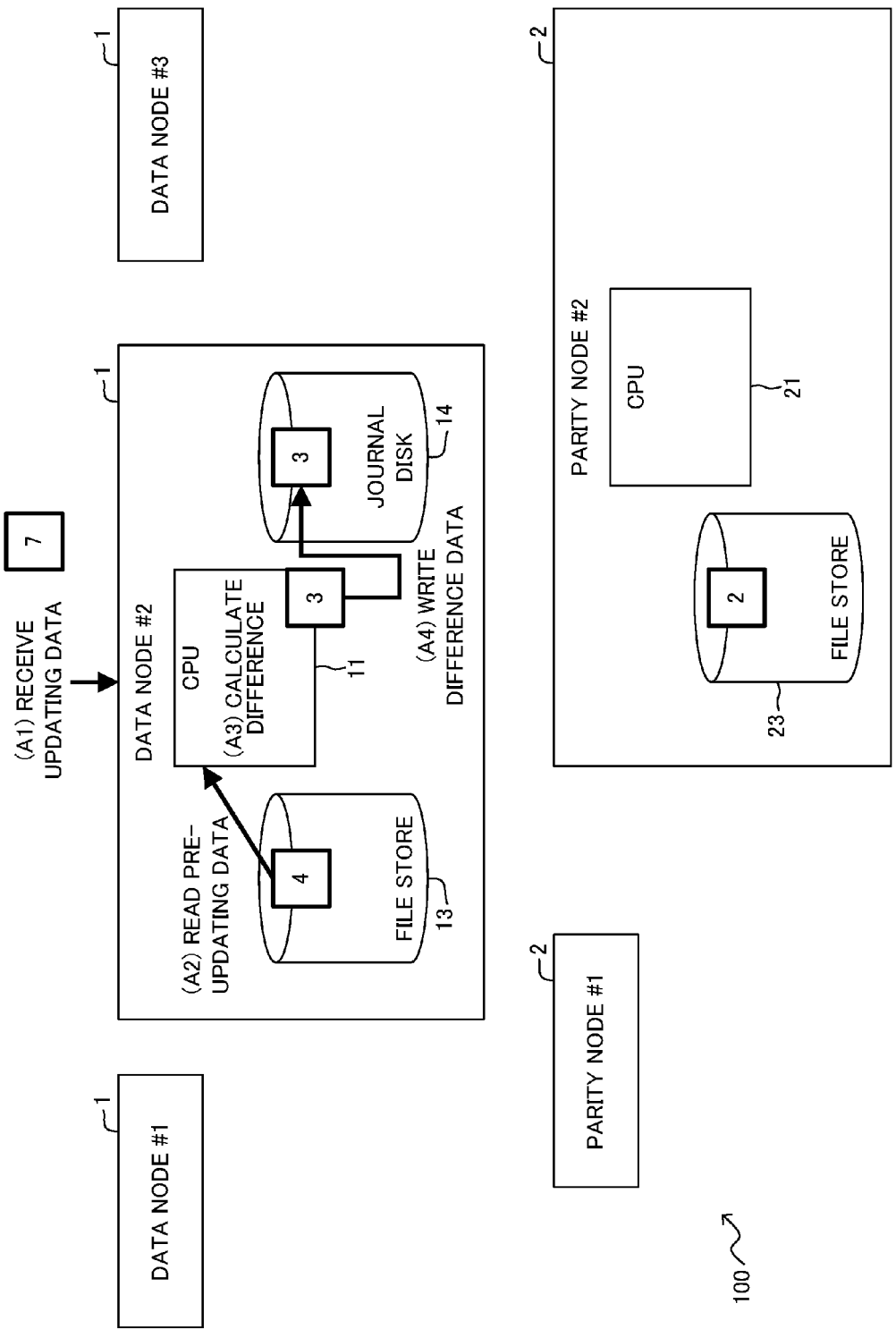
FIG. 5 is a diagram denoting a process of writing a journal in a storage system of the first embodiment.
Figure 6:
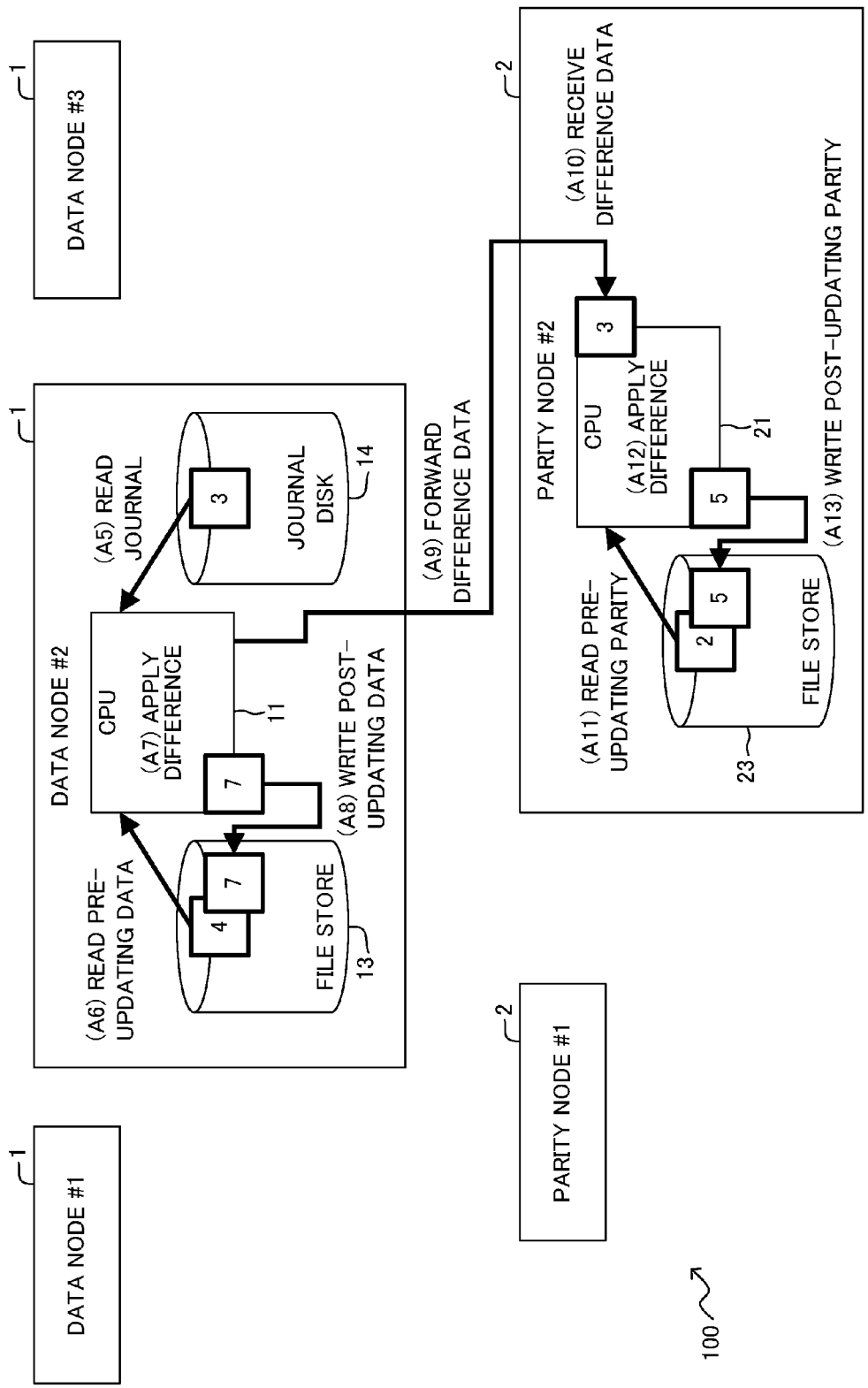
FIG. 6 is a diagram is a diagram denoting a process of applying a journal in a storage system of the first embodiment.

FIGS. 4-6 describe a process of writing a journal and a process of applying a journal in the data node #2 and the parity node #2. For simplification, illustration of the functional configurations of the data nodes #1 and #3 and parity node #1 is omitted, and illustration of the memory 12 and the memory 22 respectively provided in the data node #2 and the parity node #2 is also omitted illustrated.

The data receiver 111 of the data node #2 receives updating data "7" from a non-illustrated host device (see step S1 of FIG. 4 and symbol A1 of FIG. 5).

The file store reader 112 reads pre-updating data "4" from the file store 13 (see step S2 of FIG. 4 and symbol A2 of FIG. 5).

The difference generator 113 calculates the difference between the updating data received by the data receiver 111 and the pre-updating data read by the file store reader 112 (see step S3 of FIG. 4 and symbol A3 of FIG. 5). In the example of FIG. 5, the difference generator 113 calculates the difference data to be the value "3" obtained by subtracting the pre-updating data "4" from the updating data "7".

The journal writer 114 writes the difference data "3" generated by the difference generator 113, as the journal, into the journal disk 14 (see step S4 of FIG. 4 and symbol A4 of FIG. 5).

The journal reader 115 reads the difference data (journal) "3" written by the journal writer 114 from the journal disk 14 at the timing of applying a journal (see step S5 of FIG. 4 and symbol A5 of FIG. 6).

The file store reader 112 reads the pre-updating data "4" from the file store 13 (see step S6 of FIG. 4 and symbol A6 of FIG. 6).

The difference applier 116 applies the difference data read by the journal reader 115 to the pre-updating data read by the file store reader 112 (see step S7 of FIG. 4 and symbol A7 of FIG. 6). In the example of FIG. 6, the difference applier 116 generates the post-updating data "7" by adding the difference data "3" to the pre-updating data "4".

The file store writer 117 writes the post-updating data "7" generated by the difference applier 116 into the file store 13 (see step S8 of FIG. 4 and symbol A8 of FIG. 6).

The data transmitter 118 forwards the difference data "3" read by the journal reader 115 to the parity node #2 (see step S9 of FIG. 4 and symbol A9 of FIG. 6) in parallel with the process of steps S6-S8 of FIG. 8 (symbols A6-A8 of FIG. 6).

The data receiver 211 of the parity node #2 receives the difference data "3" forwarded by the parity node #1 (see step S10 of FIG. 4 and symbol A10 of FIG. 6).

The file store reader 212 reads the pre-updating parity "2" from the file store 23 (see step S11 of FIG. 4 and symbol A11 of FIG. 6).

The difference applier 213 applies the difference data received by the data receiver 211 to the pre-updating parity read by the file store reader 212 (see step S12 of FIG. 4 and symbol A12 of FIG. 6). In the example of FIG. 6, the difference applier 213 generates the post-updating parity "5" by adding the difference data "3" to the pre-updating parity "2".

The file store writer 214 writes the post-updating parity "5" generated by the difference applier 213 into the file store 23 (see step S13 of FIG. 4 and symbol A13 of FIG. 6).

The above procedure completes the process of writing a journal and the process of applying the journal.

(A-3) Effects:

In the data node 1, the difference generator 113 generates the difference data representing the difference between the updating data received from the superordinate device and the pre-updating data stored in the file store 13. Then, the journal disk 14 stores the difference data generated by the difference generator 113.

In the parity node 2, the data receiver 211 receives the difference data transmitted from the data transmitter 118 of the data node 1. The difference applier 213 generates the post-updating parity to be written into the file store 23 by applying the difference data received by the data receiver 211 to the pre-updating parity stored in the file store 23.

This allows the distributed storage system 100 to have a less disk volume. Specifically, the parity node 2 has no need to have a journal disk, so that the storage resource of the parity node 2 can be more effectively used. The parity node 2 does not have to write a journal and consequently the load on the disk I/O can be lightened when a journal is to be applied. Furthermore, a process of applying a journal to the file store 23 of the parity node 2 can be precisely accomplished.

In the data node 1, the difference applier 116 generates the post-updating data to be written into the file store 13 by applying the difference data stored in the journal disk 14 to the pre-updating data stored in the file store 13.

This can precisely accomplish the process of applying a journal to the file store 13 of the data node 1.

The difference generator 113 generates the difference data through the calculation on the Galois Field using the updating data received from the superordinate device and the pre-updating data stored in the file store 13.

This allows the difference generator 113 to easily calculate the difference.

(B) Others

The technique disclosed above is not limited to the foregoing embodiment and various changes and modifications can be suggested without departing from the spirit of the above embodiment. The configurations and steps of the above embodiment can be omitted, selected, or combined according to the requirement.

The disclosed storage system allows a distributed storage system to have a less disk volume.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A distributed storage system comprising:
    a first information processor that stores data;
    a second information processor that is communicably connected to the first information processor and that stores a parity of the data stored in the first information processor; and
    a host device that is communicably connected to the first information processor,
    the first information processor comprising:
        a first memory device that stores the data;
        a difference generator that generates difference data representing a difference between updated data received from the host device and the data stored in the first memory device;
        a second memory device stores the difference data generated by the difference generator; and
        a data transmitter that transmits the difference data stored in the second memory device to the second information processor,
    the second information processor comprising:
        a third memory device that stores the parity;
        a data receiver that receives the difference data transmitted from the data transmitter; and
    a parity difference applier that generates an updated parity that is to be written into the third memory device by applying the difference data received by the data receiver to the parity stored in the third memory device.

2. The storage system according to claim 1, the first information processor further comprising a data difference applier that generates updated data that is to be written into the first memory device by applying the difference data stored in the second memory device to the data stored in the first memory device.

3. The storage system according to claim 1, wherein the difference generator generates the difference data by calculation using the updated data received from the host device and the data stored in the first memory device on a Galois Field.

4. The storage system according to claim 1, wherein the difference data to be stored in the second memory device is used as a journal of data to be written into the first memory device and a parity to be written into the third memory device.

5. An information processor for a distributed storage system including a host device and a second information processor, the information processor comprising:
- a first memory device that stores the data;
- a difference generator that generates difference data representing a difference between updated data received from the host device and the data stored in the first memory device;
- a second memory device stores the difference data generated by the difference generator; and
- a data transmitter that transmits the difference data stored in the second memory device to the second information processor which stores a parity of the data stored in the first memory, the difference data being used for generating an updated parity in the second information processor.

6. The information processor according to claim 5, further comprising a data difference applier that generates updated data that is to be written into the first memory device by applying the difference data stored in the second memory device to the data stored in the first memory device.

7. The information processor according to claim 5, wherein the difference generator generates the difference data by calculation using the updated data received from the host device and the data stored in the first memory device on a Galois Field.

8. The information processor according to claim 5, wherein the difference data to be stored in the second memory device is used as a journal of data to be written into the first memory device and a parity to be stored in the second information processor.

9. A non-transitory computer-readable recording medium storing a program for generating a parity, the program causing a computer provided for an information processor for a distributed storage system including a host device and a second information processor to execute:
- storing data in a first memory;
- generating difference data representing a difference between updated data received from the host device and the data stored in the first memory device provided for the information processor;
- storing the generated difference data in a second memory device provided for the first information processor; and
- transmitting the difference data stored in the second memory device to the second information processor which stores a parity of the data stored in the first memory, the difference data being used for generating an updated parity in the second information processor.

10. The non-transitory computer-readable recording medium according to claim 9, wherein the program further causes the computer to execute generating updated data that is to be written into the first memory device by applying the difference data stored in the second memory device to the data stored in the first memory device.

11. The non-transitory computer-readable recording medium according to claim 9, wherein the program further causes the computer to execute generating the difference data by calculation using the updated data received from the host device and the data stored in the first memory device on a Galois Field.

12. The non-transitory computer-readable recording medium according to claim 9, wherein the difference data to be stored in the second memory device is used as a journal of data to be written into the first memory device and a parity to be stored in the second information processor.

* * * * *